United States Patent [19]

Ipri

[11] 4,263,057
[45] Apr. 21, 1981

[54] METHOD OF MANUFACTURING SHORT CHANNEL MOS DEVICES

[75] Inventor: Alfred C. Ipri, Princeton, N.J.

[73] Assignee: RCA Corporation, New York, N.Y.

[21] Appl. No.: 116,896

[22] Filed: Jan. 30, 1980

Related U.S. Application Data

[62] Division of Ser. No. 897,807, Apr. 19, 1978, Pat. No. 4,225,875.

[51] Int. Cl.³ .................... H01L 21/20; H01L 29/78; H01L 21/265
[52] U.S. Cl. .................................. 148/1.5; 148/187; 357/23; 357/91
[58] Field of Search .................. 148/1.5, 187, 186; 357/91, 23

[56] References Cited

U.S. PATENT DOCUMENTS

| 4,050,965 | 9/1977 | Ipri et al. | 148/175 |
| 4,089,712 | 5/1978 | Joy et al. | 148/175 |
| 4,124,933 | 11/1978 | Nicholas | 29/578 |
| 4,131,497 | 12/1978 | Feng et al. | 148/187 |

OTHER PUBLICATIONS

Ipri et al., IEEE Trans. Electron Devices, Sep. 1976, pp. 1110–1112.

Primary Examiner—L. Dewayne Rutledge
Assistant Examiner—Upendra Roy
Attorney, Agent, or Firm—Birgit E. Morris; D. S. Cohen; Lawrence P. Benjamin

[57] ABSTRACT

A short channel MOS transistor and the method for fabricating same is described wherein the dopant concentrations of the source and drain regions are maintained at different levels of conductivity modifiers. The method described teaches first doping the source region while maintaining the drain region masked and then doping both the source and drain regions.

10 Claims, 5 Drawing Figures

METHOD OF MANUFACTURING SHORT CHANNEL MOS DEVICES

This is a division of application Ser. No. 897,807, filed Apr. 19, 1978, now U.S. Pat. No. 4,225,875.

This invention relates to MOS devices and more particularly to a novel short channel MOS device and the method of fabricating the same.

In my copending application entitled "METHOD OF MAKING NARROW SILICON LINES AND SEMICONDUCTOR DEVICES MADE WITH SUCH LINES", Ser. No. 852,931, filed Nov. 18, 1977, now abandoned, and assigned to the same assignee as the subject application, I describe a short channel semiconductor device and the method of fabricating it. That application is incorporated herein, in its entirety, by reference.

The above mentioned application is directed to short or narrow gates formed by doped polycrystalline silicon (polysilicon) lines formed by the controlled doping of only those exposed edges of a layer of polysilicon. While the described process does, in fact, produce shorter channel regions than heretofore possible with standard photolithographic techniques, it has been found that the maximum operating voltage of such devices is significantly low. In certain instances, this is highly desirable, as for example, where power and heat dissipation considerations dictate the use of low current and low voltage. One rationale for explaining the lower operating voltage resides in the fact that the maximum operating voltage is a function of the source-to-drain spacing. As this spacing is reduced (made shorter) the maximum operating voltage is concomitantly reduced.

However, there are many desirable uses for short channel devices having high operating voltages and an obvious attempt at a solution for achieving such higher voltages would be to reduce the doping concentration of both the source and drain regions. This would be accomplished quite easily since, traditionally, both the source and drain regions are doped simultaneously. Such a solution would then allow the drain-substrate depletion region (the band that extends around the drain region at the substrate) to extend into both the gate and drain regions. The resultant increase in source-to-drain punch-through voltage will be accompanied by a correspondingly increased operating voltage. Since the source and drain regions are doped to the same level, the overall speed of the device will be significantly reduced due to the increased "R-C" (resistance-capacitance) time constance of the device.

In accordance with the teachings of my invention, a short channel device and the method for fabricating the device is described wherein the concentrations of conductivity modifiers in the source and drain regions are maintained at different levels. In the described embodiment, the source region is defined and doped to a first level while maintaining the drain region masked and, therefore, undoped. Thereafter, the mask covering the drain region is removed and both the source and drain regions are doped. The net result is a device having a source region doped to a considerably higher level than the drain region.

Figure 1:
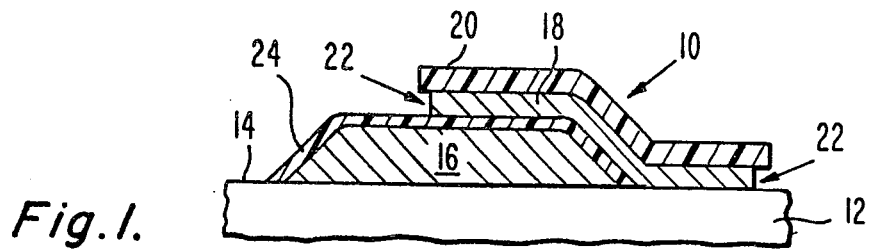
FIGS. 1, 2 and 3A are sectional views illustrating the steps of carrying out the method of the present invention.

Referring now to FIG. 1, there is herein presented one method of fabricating a silicon-on-sapphire short channel, MOS device embodying the subject invention. While the following exegesis will be presented in terms of a silicon-on-sapphire device, it will be obvious to those skilled in the art that while body 12 will be referred to as sapphire other insulative substrates such as spinel or monocrystalline beryllium oxide may be used with no deleterious effects. Further, while body 12 may be a substrate or insulating material it should also be obvious that it may be either a semiconductor material or a layer of a semiconductor material on a substrate, depending on the device being made. Additionally, while there will be described the fabrication of an N channel device, I do not wish to be so limited since it is readily obvious that a P channel device may also be fabricated using the teachings of my invention.

The construction of the configuration of structure 10 is described in detail in my copending application. Briefly, a layer of monocrystalline silicon is deposited on surface 14 of body 12 using any one of many well known techniques one of which is the thermal decomposition of silane in a hydrogen carrier. After the deposition of the polysilicon layer, the layer is masked to expose certain areas and the exposed areas are then etched down to the substrate with the unetched areas forming island 16. Thereafter, island 16 is provided with a layer of dielectric or dielectrics 24 which may be formed either by the oxidation of the surface of silicon island 16 or by the thermal decomposition of silane in an oxidizing atmosphere. Island 16 is next provided with a polysilicon layer (over layer 24) followed by a layer 20 of masking oxide, utilizing any one of many well known techniques. Layer 20 is then provided with a patterned layer of photoresist (not shown) and the exposed portion of masking oxide layer 20 is etched down to monocrystalline silicon layer 18 in order to allow the remaining, unetched portions of layer 20 to act as a mask for the subsequent etching of layer 18. At this point, all exposed portions of polysilicon layer 18 are removed by subjecting structure 10 to a buffered potassium hydroxide etchant which, not only removes the exposed polysilicon but will generally etch under the edges of masking layer 20. These techniques are also well known.

Structure 10 is then subjected to a P-type dopant and heated. The particular dopant used for the P-type dopant is boron in the form of diborane. As indicated by arrows 22, the dopant gas will contact only the exposed edges of polysilicon layer 18 so that the dopant will diffuse into the layer 18 laterally along the polysilicon layer, from the exposed edges inwardly thereof. This procedure forms a P-type doped polysilicon strip 18.1 along each of the exposed edges of polysilicon layer 18. Since the diffusion constant of polysilicon layer 18 is well known, the diffusion of the dopant into layer 18 may be accurately controlled by monitoring the time and temperature of the diffusion. Accordingly, the width of the resultant doped polysilicon strips 18.1 can be accurately controlled to provide narrow widths.

Figure 2:
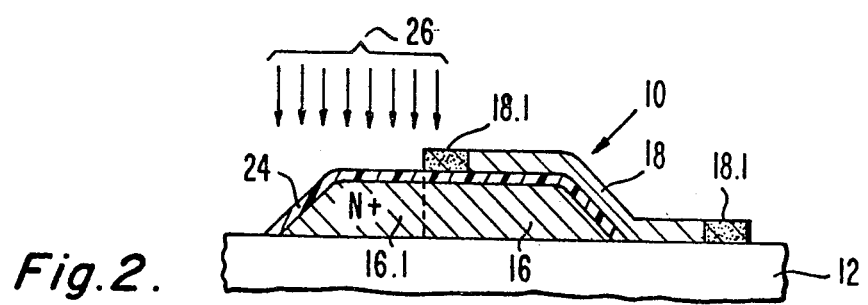

As shown in FIG. 2 doped strips 18.1 appear wherever the exposed edges of polysilicon layer 18 reacted with the boron dopant. In this particular embodiment, I have chosen to form a closed loop gate (as shown in FIG. 3B) although other configurations will now become obvious. As shown in FIG. 2, after the formation of doped strips 18.1, masking silicon dioxide layer 20 is removed using a buffered hydrogen fluoride solution to expose the doped (18.1) and the undoped (18) portons of the polysilicon layer. Using layer 18 and strips 18.1 as a mask, the device is now subjected to a phosphorous implant, as indicated by arrows 26, to delineate one edge of the channel and form the source region 16.1. An implantation of phosphorous ions at a dose of $1 \times 10^{16}$ ions per cm$^2$ at 50 Kev results in a concentration of about $10^{20}$/cm$^3$ of conductivity modifiers in source region 16.1.

Figure 3A:
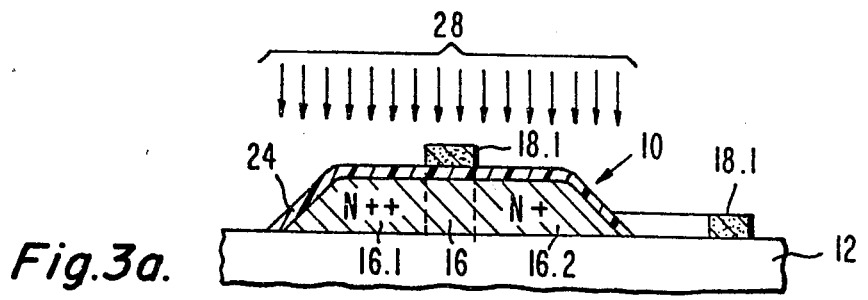
Figure 3B:
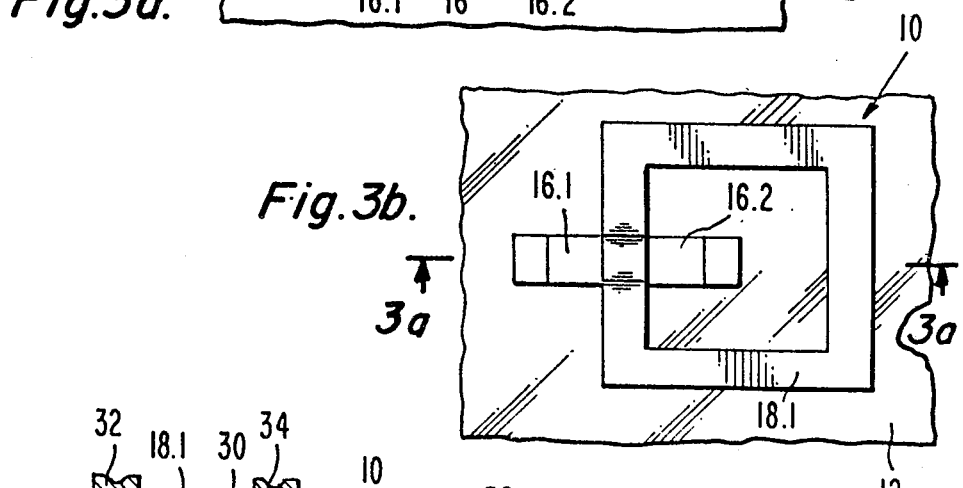
FIG. 3B is a partial plan view of FIG. 3A.

Referring now to FIGS. 3A and 3B, the next step is to remove undoped polysilicon 18 which may be done by subjecting device 10 to a suitable etching solution until such time as all undoped polysilicon is removed. Such solvents are described in U.S. Pat. No. 3,738,880 and include aqueous hydryzine or potassium hydroxide-propanol solutions and the like. The use of any of these solutions will selectively remove only the undoped portion of polysilicon leaving doped polysilicon strips 18.1 unaffected. Thereafter, as shown by arrows 28, the entire device is subjected to another phosphorous ion implantation at a dose of about $1 \times 10^{14}$ ions per cm$^2$ at 50 Kev resulting in the completion of the channel region and the formation of drain region 16.2 having a concentration of $10^{18}$/cm$^3$ conductivity modifiers therein. The source region 16.1 will now have a concentration of about $1.01 \times 10^{20}$/cm$^3$ conductivity modifiers as a result of the second implant. This represents an increase in conductivity modifiers, in the source region, of about two (2) orders of magnitude greater than that of the drain region.

Figure 4:
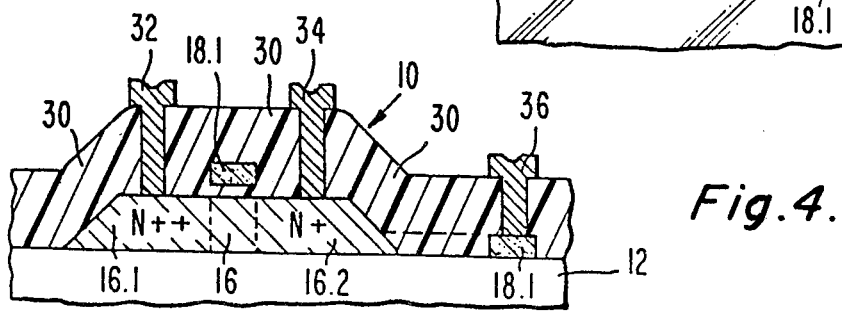
FIG. 4 is a sectional view of the short-channel MOS device made in accordance with the method of the present invention.

Thereafter, as shown in FIG. 4, the device is completed by the formation of field oxide 30 in a well known manner followed by the formation of contact openings and the deposition of metallic contacts 32, 34 and 36 in ohmic contact with source 16.1, drain 16.2 and gate 18.1 respectively.

There is thus provided a novel short channel MOS device wherein the source region is provided with a higher concentration of conductivity modifiers therein than the drain region.

What is claim is:

1. A method of fabricating a semiconductor device, comprising the steps of:
   providing a body of semiconductor material of a first conductivity type, the body having a common boundary surface;
   defining a first active region in the body of semiconductor material by masking a portion of the common boundary surface;
   introducing a first concentration of conductivity modifiers into the first region of the body of semiconductor material to dope the entire first region to an opposite conductivity type;
   defining a second active region in the body of semiconductor material, separated from the first region, by removing only a portion of the mask;
   introducing a second concentration of conductivity modifiers into the second region of the body of semiconductor material to dope the entire second region to the opposite conductivity type; and
   simultaneously introducing conductivity modifiers into the first region, when the second region is being doped in order to dope the entire first region with a concentration of conductivity modifiers that is about two orders of magnitude higher than the second region.

2. The method of fabricating the semiconductor device of claim 1, wherein the step of defining the first region comprises the further steps of:
   forming a layer of dielectric material on the body of semiconductor material;
   forming a layer of polycrystalline silicon on the layer of dielectric material;
   masking selected portions of the polycrystalline silicon layer with a layer of patterned masking material;
   etching the unmasked portions of the polycrystalline silicon to expose the first region; and
   doping exposed edges of the polycrystalline silicon layer, between the layer of masking material and the layer of oxide material to form lines of doped polycrystalline silicon in the layer thereof.

3. The method of fabricating the semiconductor device of claim 1, wherein:
   the body of semiconductor material is affixed to an insulative substrate, the substrate being selected from the group consisting of sapphire, spinel or monocrystalline beryllium oxide.

4. The method of fabricating the semiconductor device of claim 2, wherein:
   the first region is doped by implanting ions of a conductivity modifier of the opposite conductivity.

5. The method of fabricating the semiconductor device of claim 4, wherein the step of defining the second region comprises the further steps of:
   removing the layer of masking material;
   etching only the undoped portion of the polycrystalline silicon layer to expose the second region; and
   implanting ions of the opposite conductivity type into both the first and second regions.

6. The method of fabricating the semiconductor device of claim 5, wherein:
   the first region is a source region; and
   the second region is a drain region.

7. The method of fabricating the semiconductor device of claim 3, wherein the step of defining the first region comprises the further steps of:
   forming a layer of dielectric material on the body of semiconductor material;
   forming a layer of polycrystalline silicon on the layer of dielectric material;
   masking selected portions of the polycrystalline silicon layer with a layer of patterned masking material;
   etching the unmasked portions of the polycrystalline silicon to expose the first region; and
   doping exposed edges of the polycrystalline silicon layer, between the layer of masking material and the layer of oxide material to form lines of doped polycrystalline silicon in the layer thereof.

8. The method of fabricating the semiconductor device of claim 7, wherein:
   the first region is doped by implanting ions of a conductivity modifier of the opposite conductivity.

9. The method of fabricating the semiconductor device of claim 8, wherein the step of defining the second region comprises the further steps of:
   removing the layer of masking material;
   etching only the undoped portion of the polycrystalline silicon to expose the second region; and
   implanting ions of the opposite conductivity type into both the first and second regions.

10. The method of fabricating the semiconductor device of claim 9, wherein:
    the first region is a source region; and
    the second region is a drain region.

* * * * *